(12) United States Patent
Choi (10) Patent No.: US 10,910,411 B2
(45) Date of Patent: Feb. 2, 2021

(54) ARRAY SUBSTRATE, MANUFACTURING METHOD THEREOF AND DISPLAY PANEL

(71) Applicant: BOE TECHNOLOGY GROUP CO., LTD., Beijing (CN)

(72) Inventor: Hyunsic Choi, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/504,780

(22) Filed: Jul. 8, 2019

(65) Prior Publication Data

US 2020/0144296 A1 May 7, 2020

(30) Foreign Application Priority Data

Nov. 1, 2018 (CN) .......................... 2018 1 1294945

(51) Int. Cl.
*H01L 27/12* (2006.01)
*G02F 1/1343* (2006.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
CPC ......... G02F 1/134309; G02F 1/134363; G02F 1/13439; G02F 1/136227; G02F 1/136286;
(Continued)

(56) References Cited

U.S. PATENT DOCUMENTS

2015/0309377 A1\* 10/2015 Choi ..................... G02F 1/1368
349/43
2016/0018938 A1 1/2016 Ding et al.
(Continued)

FOREIGN PATENT DOCUMENTS

CN 103455201 A 12/2013
CN 103676375 A 3/2014
(Continued)

OTHER PUBLICATIONS

First Office Action and English language translation, CN Application No. 201811294945.3, dated Mar. 24, 2020, 14 pp.
(Continued)

*Primary Examiner* — Karen Kusumakar
*Assistant Examiner* — Adam S Bowen
(74) *Attorney, Agent, or Firm* — Myers Bigel, P.A.

(57) ABSTRACT

An array substrate is provided that includes a plurality of sub-pixels arranged in a matrix. Each of the sub-pixels includes a substrate, a gate, a source and a drain, and a common electrode on the substrate, a passivation layer on a side of the common electrode facing away from the substrate, and a pixel electrode on a side of the passivation layer facing away from the substrate. The array substrate further includes a common electrode line, the common electrode line being formed of a same material in a same layer as the source and the drain. The common electrode is in direct electrical contact with the common electrode line. The pixel electrode and the drain are electrically connected through a via hole in the passivation layer. A display panel and a method for manufacturing an array substrate are further provided.

20 Claims, 7 Drawing Sheets (51) Int. Cl.
*G02F 1/1362* (2006.01)
*G02F 1/1368* (2006.01)
*H01L 23/552* (2006.01)

(52) U.S. Cl.
CPC .. *G02F 1/134309* (2013.01); *G02F 1/134363* (2013.01); *G02F 1/136227* (2013.01); *G02F 1/136286* (2013.01); *H01L 23/552* (2013.01); *H01L 27/1259* (2013.01); *G02F 2001/134318* (2013.01); *G02F 2001/134345* (2013.01); *G02F 2001/136295* (2013.01); *G02F 2201/121* (2013.01); *G02F 2201/122* (2013.01); *G02F 2201/123* (2013.01); *G02F 2201/50* (2013.01)

(58) Field of Classification Search
CPC ........ G02F 2001/134318; G02F 2001/134345; G02F 2001/136295; G02F 2201/121; G02F 2201/122; G02F 2201/123; G02F 2201/50; H01L 23/552; H01L 27/1248
USPC .......................................................... 257/72
See application file for complete search history.

(56) References Cited

U.S. PATENT DOCUMENTS

| | | | | |
|---|---|---|---|---|
| 2016/0252793 | A1* | 9/2016 | Cheng | H01L 29/66765 257/72 |
| 2016/0299392 | A1* | 10/2016 | Cheng | G02F 1/134309 |
| 2016/0343735 | A1* | 11/2016 | Chen | H01L 27/124 |
| 2017/0219887 | A1* | 8/2017 | Deng | G02F 1/136286 |
| 2017/0278868 | A1* | 9/2017 | Tian | G02F 1/1368 |

FOREIGN PATENT DOCUMENTS

| | | |
|---|---|---|
| CN | 104835782 A | 8/2015 |
| JP | 2013-210652 A | 10/2013 |

OTHER PUBLICATIONS

"Notice of Second Review Opinion and English language translation", CN Application No. 201811294945.3, dated Dec. 13, 2020, 14 pp.

* cited by examiner

ARRAY SUBSTRATE, MANUFACTURING METHOD THEREOF AND DISPLAY PANEL

CROSS REFERENCE TO RELATED APPLICATIONS

The present application claims the benefit of Chinese Patent Application No. 201811294945.3, filed on Nov. 1, 2018, the entire disclosure of which is incorporated herein by reference.

FIELD

The present disclosure relates to the field of display technologies, and in particular to an array substrate, a manufacturing method thereof, and a display panel.

BACKGROUND

Liquid crystal display technology has developed rapidly, and has become a new star in current industrial circles and a highlight of economic development. While the liquid crystal display is booming, wide viewing angle, high image quality, fast response speed and the like have become urgent requirements for liquid crystal display devices.

SUMMARY

An aspect of the present disclosure provides an array substrate comprising a plurality of sub-pixels arranged in a matrix, each sub-pixel comprising: a substrate, a gate, a source and a drain, and a common electrode on the substrate, a passivation layer on a side of the common electrode facing away from the substrate, and a pixel electrode on a side of the passivation layer facing away from the substrate. The array substrate further comprises a common electrode line, the common electrode line is formed of a same material in a same layer as the source and the drain, the common electrode is in direct electrical contact with the common electrode line, and the pixel electrode and the drain are electrically connected through a via hole in the passivation layer.

According to some exemplary embodiments of the present disclosure, the common electrode covers at least a portion of the common electrode line.

According to some exemplary embodiments of the present disclosure, the above array substrate further comprises a plurality of gate lines extending in a first direction and a plurality of data lines extending in a second direction, each of the gate lines being electrically connected to gates of a plurality of sub-pixels arranged in the first direction, each of the data lines being electrically connected to sources of a plurality of sub-pixels arranged in the second direction; and a shielding line, an orthographic projection of the shielding line on the substrate covering orthographic projections of one or more of the gate lines and the data lines on the substrate.

According to some exemplary embodiments of the present disclosure, the shielding line is formed of a same material in a same layer as the pixel electrode.

According to some exemplary embodiments of the present disclosure, the shielding line is electrically connected to the common electrode line.

According to some exemplary embodiments of the present disclosure, the above array substrate comprises a plurality of the common electrode lines extending in parallel, each of the common electrode lines being electrically connected to common electrodes of a plurality of sub-pixels arranged in an extension direction of the common electrode line. The array substrate further comprises a peripheral area surrounding a display area, the peripheral area being provided with a common electrode auxiliary line that is electrically connected to the plurality of the common electrode lines.

According to some exemplary embodiments of the present disclosure, the above array substrate further comprises a plurality of gate lines extending in a first direction and a plurality of data lines extending in a second direction, each of the gate lines being electrically connected to gates of a plurality of sub-pixels arranged in the first direction, each of the data lines being electrically connected to sources of a plurality of sub-pixels arranged in the second direction; and a shielding line, an orthographic projection of the shielding line on the substrate covering orthographic projections of one or more of the gate lines and the data lines on the substrate. The plurality of data lines are parallel to the plurality of common electrode lines, and the common electrode auxiliary line is electrically connected to the shielding line.

According to some exemplary embodiments of the present disclosure, the pixel electrode is a slit electrode, and the common electrode is one of a platelike electrode and a slit electrode.

Another aspect of the present disclosure provides a display panel comprising any of the array substrates described above.

According to some exemplary embodiments of the present disclosure, the common electrode covers at least a portion of the common electrode line.

According to some exemplary embodiments of the present disclosure, the above display panel further comprises a plurality of gate lines extending in a first direction and a plurality of data lines extending in a second direction, each of the gate lines being electrically connected to gates of a plurality of sub-pixels arranged in the first direction, each of the data lines being electrically connected to sources of a plurality of sub-pixels arranged in the second direction; and a shielding line, an orthographic projection of the shielding line on the substrate covering orthographic projections of one or more of the gate lines and the data lines on the substrate.

According to some exemplary embodiments of the present disclosure, the shielding line is formed of a same material in a same layer as the pixel electrode.

According to some exemplary embodiments of the present disclosure, the shielding line is electrically connected to the common electrode line.

According to some exemplary embodiments of the present disclosure, the array substrate comprises a plurality of the common electrode lines extending in parallel, each of the common electrode lines being electrically connected to common electrodes of a plurality of sub-pixels arranged in an extension direction of the common electrode line. The array substrate further comprises a peripheral area surrounding a display area, the peripheral area being provided with a common electrode auxiliary line that is electrically connected to the plurality of common electrode lines.

According to some exemplary embodiments of the present disclosure, the above display panel further comprises a plurality of gate lines extending in a first direction and a plurality of data lines extending in a second direction, each of the gate lines being electrically connected to gates of a plurality of sub-pixels arranged in the first direction, each of the data lines being electrically connected to sources of a plurality of sub-pixels arranged in the second direction; and a shielding line, an orthographic projection of the shielding line on the substrate covering orthographic projections of one or more of the gate lines and the data lines on the substrate. The plurality of data lines are parallel to the plurality of common electrode lines, and the common electrode auxiliary line is electrically connected to the shielding line.

According to some exemplary embodiments of the present disclosure, the pixel electrode is a slit electrode, and the common electrode is one of a platelike electrode and a slit electrode.

A further aspect of the present disclosure provides a method for manufacturing an array substrate, comprising: forming a gate, a source and a drain, and a common electrode on a substrate; forming a passivation layer on a side of the common electrode facing away from the substrate; and forming a pixel electrode on a side of the passivation layer facing away from the substrate. The method for manufacturing an array substrate further comprises forming a common electrode line, the common electrode line being formed by a same patterning process as the source and the drain, the common electrode being in direct electrical contact with the common electrode line. The pixel electrode and the drain are electrically connected through a via hole in the passivation layer.

According to some exemplary embodiments of the present disclosure, the common electrode covers at least a portion of the common electrode line.

According to some exemplary embodiments of the present disclosure, the above method for manufacturing an array substrate further comprises forming a plurality of gate lines extending in a first direction and a plurality of data lines extending in a second direction; and forming a shielding line such that an orthographic projection of the shielding line on the substrate covers orthographic projections of one or more of the gate lines and the data lines on the substrate.

According to some exemplary embodiments of the present disclosure, the shielding line and the pixel electrode are formed by a same patterning process.

BRIEF DESCRIPTION OF DRAWINGS

In order to illustrate the technical solutions in embodiments of the present disclosure more clearly, the drawings to be used for description of the embodiments will be briefly described below. It is apparent that the drawings in the description below are only some of the embodiments of the present disclosure, and other drawings may be further obtained by those ordinarily skilled in the art based on these drawings without spending inventive efforts.

DETAILED DESCRIPTION

The technical solutions in embodiments of the present disclosure will be clearly and completely described below with reference to the accompanying drawings in the embodiments of the present disclosure. It is obvious that the described embodiments are only a part of the embodiments of the present disclosure, rather than all of them. All other embodiments obtained by those ordinarily skilled in the art based on the embodiments of the present disclosure without spending inventive efforts fall within the scope of the present disclosure.

In the description of the present disclosure, it is to be understood that the orientations or positional relationships indicated by terms "center", "upper", "lower", "front", "back", "left", "right", "vertical", "horizontal", "top", "bottom", "inside", "outside", and the like are based on the orientations or positional relationships shown in the drawings, and are merely for the convenience of describing the present disclosure and simplifying the description, rather than indicating or implying that a device or component referred to must have a particular orientation, and be constructed and operated in a particular orientation, which are not to be construed as limiting the present disclosure. In the description of the present disclosure, "plurality" means two or more unless specified otherwise.

Advanced Super Dimensional Switching (ADS) technology is a "edge field switching technology". Its core technical characteristic can be described as: a multi-dimensional electric field is formed by an electric field generated by edges of slit electrodes in a same plane and an electric field generated between a slit electrode layer and a platelike electrode layer, such that all the aligned liquid crystal molecules located between the slit electrodes in the liquid crystal cell and directly above the electrodes can be deflected, thereby improving the working efficiency of liquid crystals and increasing the light transmission efficiency. The advanced super dimensional switching technology can improve the image quality of a liquid crystal display device, so that the liquid crystal display device has high resolution, high transmittance, low power consumption, wide viewing angle, high aperture ratio, low chromatic aberration, no push mura, and other advantages.

In a liquid crystal display device based on this technology, it is necessary to dispose electrodes capable of generating the above-described multi-dimensional electric field, i.e., a pixel electrode and a common electrode, on the array substrate. The pixel electrode and the common electrode are both typically made of a transparent conductive material such as ITO (Indium Tin Oxide), and the common electrode is usually laid over a large area. However, the large-area laying of the common electrode easily leads to a problem of a large voltage drop across the common electrode.

Figure 1:
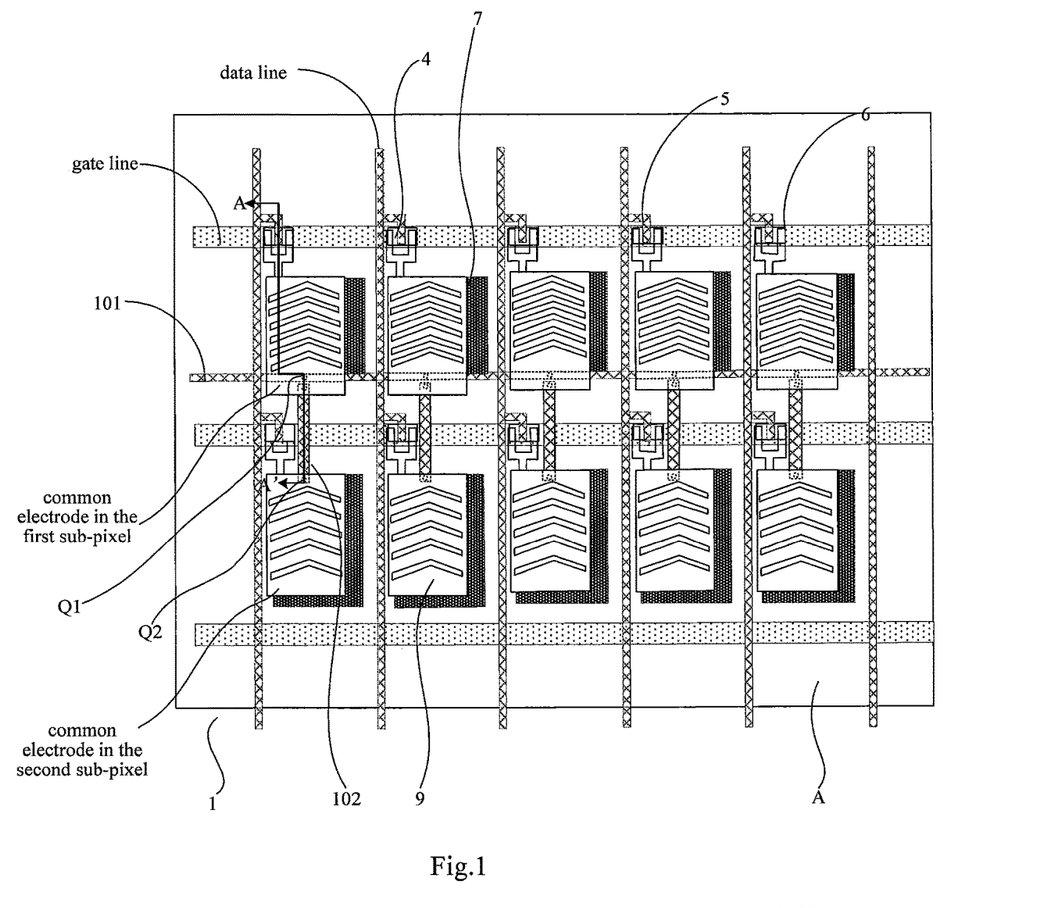
FIG. 1 is a plan view of an array substrate provided by the related art.
Figure 2:
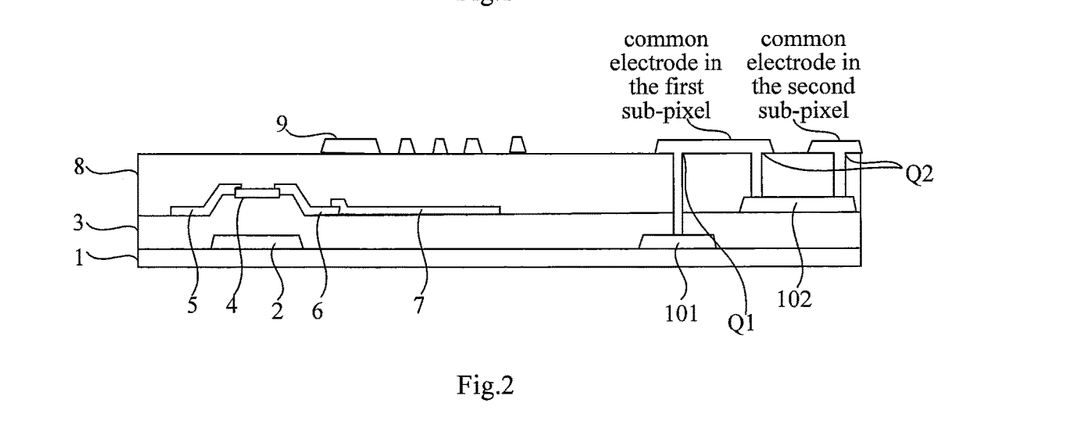
FIG. 2 is a sectional view of an array substrate provided by the related art taken along the A-A' direction in FIG. 1.

FIG. 1 and FIG. 2 are schematic structural views of an array substrate provided by the related art. The array substrate comprises a plurality of gate lines extending in a first direction and a plurality of data lines extending in a second direction. The gate lines and the data lines divide the array substrate into a plurality of sub-pixels arranged in a matrix and located in a display area (AA area) A. Each of the sub-pixels comprises: a substrate 1, and a gate 2, a gate insulating layer 3, a semiconductor layer 4, a source 5 and a drain 6, a pixel electrode 7, a passivation layer 8, and a common electrode 9 which are disposed on the substrate 1 successively. On such basis, the array substrate further comprises a first common electrode line 101 and a second common electrode line 102. Each first common electrode line 101 extends in the first direction and electrically connects common electrodes 9 in a row of sub-pixels arranged in the first direction. Each second common electrode line 102 extends in the second direction and electrically connects two common electrodes 9 that are adjacent in the second direction (for example, the common electrode 9 in a first sub-pixel and the common electrode 9 in a second sub-pixel as shown in FIG. 1 and FIG. 2). The first direction intersects the second direction.

It is to be noted that, due to the viewing angle and the viewing position, FIG. 1 only shows the gate lines, the data lines, the semiconductor layer 4, the source 5, the drain 6, the pixel electrode 7, and the common electrode 9, not showing the gate insulating layer 3 and the passivation layer 8. Correspondingly, FIG. 2 only shows the gate 2, the gate insulating layer 3, the semiconductor layer 4, the source 5, the drain 6, the pixel electrode 7, the passivation layer 8 and the common electrode 9 in FIG. 1, not showing the gate lines and the data lines.

As shown in FIG. 2, in the case where the first common electrode line 101 is in the same layer as the gate 2, and the second common electrode line 102 is in the same layer as the source 5 and the drain 6, for each common electrode 9, it needs to be electrically connected to the first common electrode line 101 through a first via hole Q1, and for the two common electrodes 9 electrically connected to each second common electrode line 102, each one needs to be electrically connected to the second common electrode line 102 through a second via hole Q2.

In the array substrate based on the above structure, although the resistances on all the common electrodes 9 can be made uniform, the manufacturing process is complicated. Moreover, since the number of via holes on the array substrate is large, and the common electrodes 9 are uneven in the via hole region and the remaining region, in case a liquid crystal alignment layer (PI layer) is coated, there will be a problem of uneven coating, which will result in an increase in the defect rate of the product.

Figure 3:
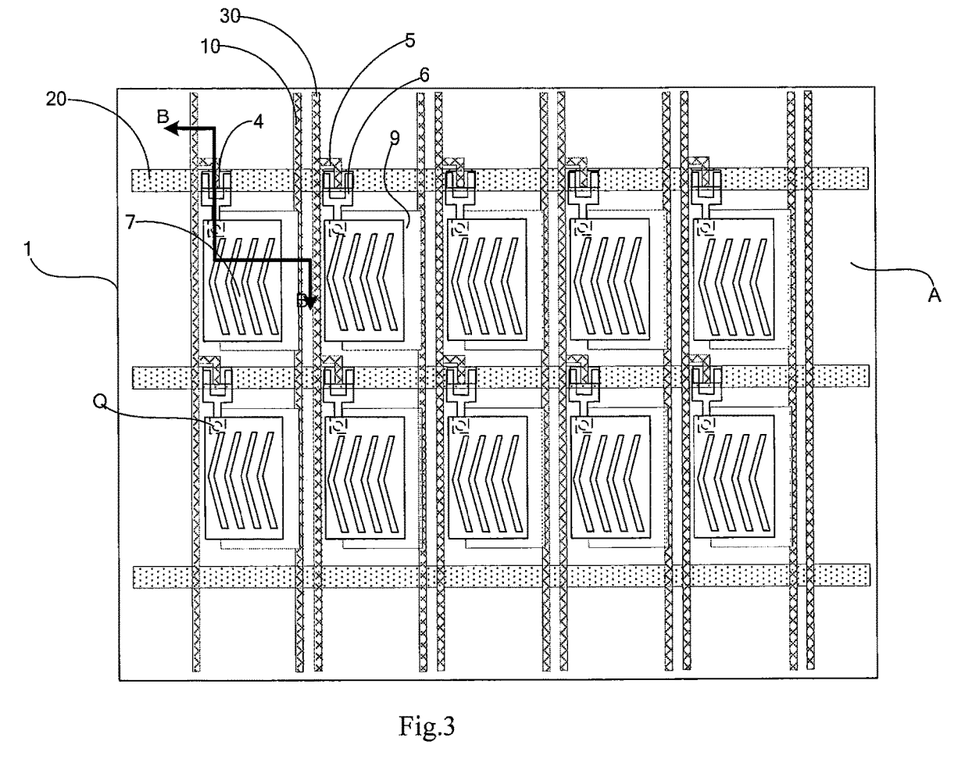
FIG. 3 is a plan view of an array substrate provided by an embodiment of the present disclosure.
Figure 4:
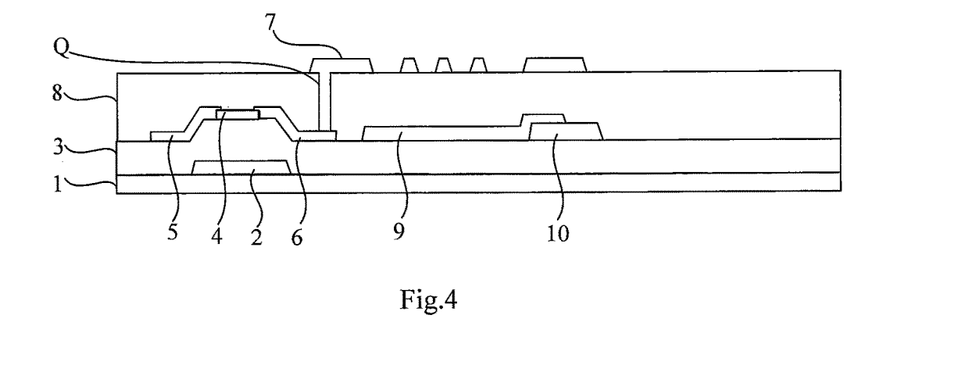
FIG. 4 is a sectional view of an array substrate provided by an embodiment of the present disclosure taken along the B-B' direction in FIG. 3.

In view of this, an embodiment of the present disclosure provides an array substrate which comprises, as shown in FIG. 3 and FIG. 4, a plurality of gate lines 20 extending in a first direction and a plurality of data lines 30 extending in a second direction. The gate lines 20 and the data lines 30 divide the array substrate into a plurality of sub-pixels arranged in a matrix and located in a display area A. Each of the sub-pixels comprises: a substrate 1, and a gate 2, a gate insulating layer 3, a semiconductor layer 4, a source 5 and a drain 6, a common electrode 9, a passivation layer 8, and a pixel electrode 7 which are disposed on the substrate 1 successively. On such basis, the array substrate further comprises a common electrode line 10. The common electrode line 10 is formed of the same material in the same layer as the source 5 and the drain 6, and the common electrode 9 is in direct contact with the common electrode line 10. The pixel electrode 7 and the drain 6 are electrically connected through a via hole Q in the passivation layer 8.

It is to be noted that, due to the viewing angle and the viewing position, FIG. 3 only shows the gate lines 20, the data lines 30, the semiconductor layer 4, the source 5, the drain 6, the pixel electrode 7 and the common electrode 9, not showing the gate insulating layer 3 and the passivation layer 8. Correspondingly, FIG. 4 only shows the gate 2, the gate insulating layer 3, the semiconductor layer 4, the source 5, the drain 6, the pixel electrode 7, the passivation layer 8 and the common electrode 9 in FIG. 3, not showing the gate lines 20 and the data lines 30. In particular, the gate 2, the gate insulating layer 3, the semiconductor layer 4, the source 5 and the drain 6 constitute a thin film transistor (TFT) in a sub-pixel. Generally, the source 5 and the drain 6 of the thin film transistor are symmetrical, thus the source 5 and the drain 6 are essentially not different. On such basis, in order to distinguish the two terminals of the thin film transistor other than the gate 2, one of the terminals is referred to as a source 5 and the other is referred to as a drain 6.

It is to be noted that although a bottom gate type thin film transistor is employed in the drawings of the present disclosure to explain the principle of the present disclosure, the present disclosure is not limited thereto, but can be equally applied to a top gate type thin film transistor.

Optionally, the semiconductor layer 4 may be one of a metal oxide semiconductor layer, an amorphous silicon semiconductor layer, a polysilicon semiconductor layer, and an organic semiconductor layer.

Since the material of the metal oxide semiconductor layer, such as zinc oxide (ZnO) and indium gallium zinc oxide (IGZO), or the material of the polysilicon semiconductor layer, such as low temperature polysilicon (LTPS), or the material of the organic semiconductor layer, such as pentacene, has a high carrier mobility, in case the thin film transistor is applied to a display, it can better satisfy the driving need of a large-sized display.

It is to be noted that the common electrode line 10 is formed of the same material in the same layer as the source 5 and the drain 6, that is, the common electrode line 10 is formed by the same patterning process as the source 5 and the drain 6.

An embodiment of the present disclosure provides an array substrate in which each sub-pixel is provided with one common electrode 9 which is connected to a common electrode line 10 and supplied with a common electrode signal through the common electrode line 10, so that the resistances on all the common electrodes 9 are uniform. On such basis, by forming the common electrode line 10 of the same material in the same layer as the source 5 and the drain 6, and making the common electrode 9 in direct contact with the common electrode line 10, the common electrode 9 can be connected to the common electrode line 10 without a via hole, while each sub-pixel is only provided with one via hole for electrically connecting the pixel electrode 7 and the drain 6. As a result, the manufacturing process for the array substrate provided by the embodiment of the present disclosure is simpler, and the problem of uneven coating of the liquid crystal alignment layer due to the large number of via holes in the related art can be improved.

In some embodiments of the present disclosure, as shown in FIG. 3 and FIG. 4, the common electrode 9 covers at least a portion of the common electrode line 10, that is, their orthographic projections on the substrate 1 at least partially overlap each other. By making the orthographic projections of the common electrode 9 and the common electrode line 10 on the substrate 1 at least partially overlap each other, a reliable electrical connection therebetween can be ensured, which can avoid contact failure.

In other embodiments of the present disclosure, as shown in FIG. 3, FIG. 5, FIG. 7 and FIG. 9, each gate line 20 is electrically connected to gates 2 in a row of sub-pixels arranged in an extension direction of said gate line 20, and each data line 30 is electrically connected to sources 6 in a column of sub-pixels arranged in an extension direction of the data line 30. On such basis, as shown in FIGS. 5 to 10, the array substrate further comprises a shielding line 40, and the orthographic projection of the shielding line 40 on the substrate 1 covers the orthographic projection of the gate line 20 and/or the data line 30 on the substrate 1.

Figure 5:
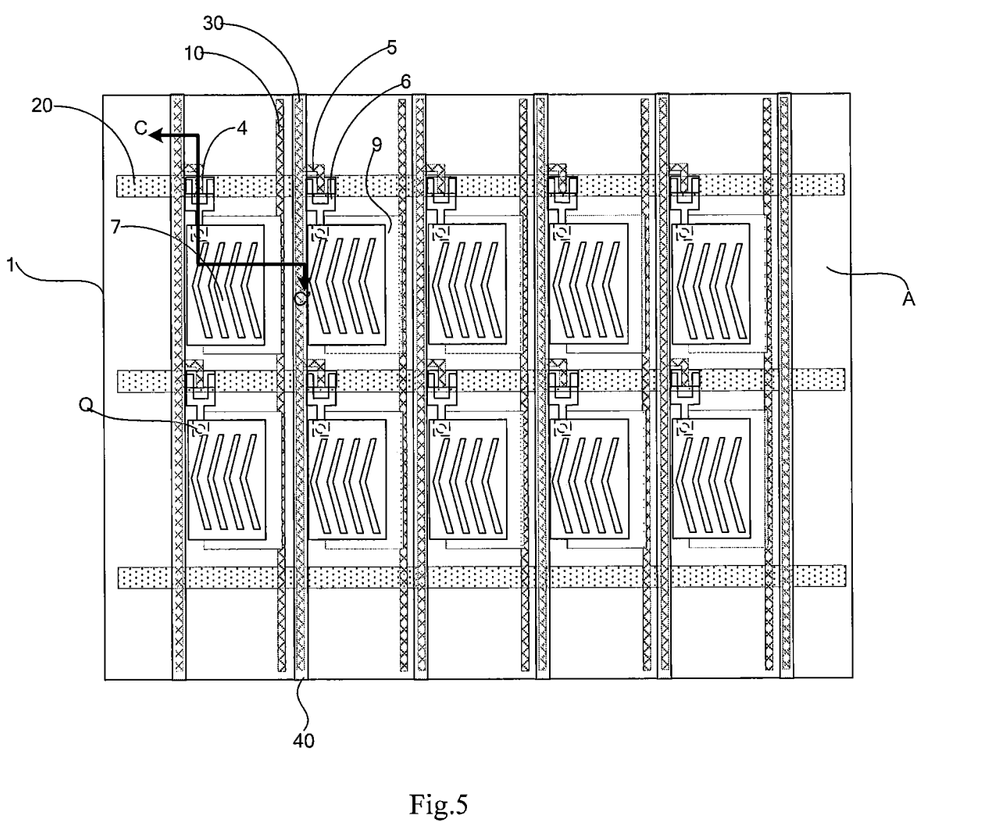
FIG. 5 is a plan view of another array substrate provided by an embodiment of the present disclosure.
Figure 6:
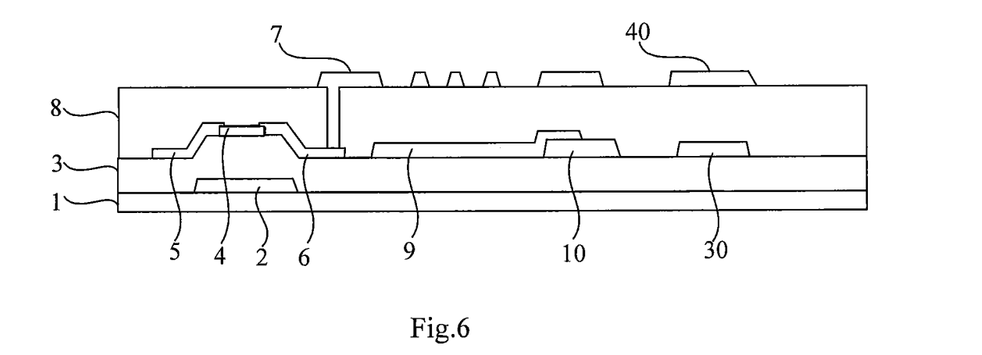
FIG. 6 is a sectional view of another array substrate provided by an embodiment of the present disclosure taken along the C-C' direction in FIG. 5.
Figure 7:
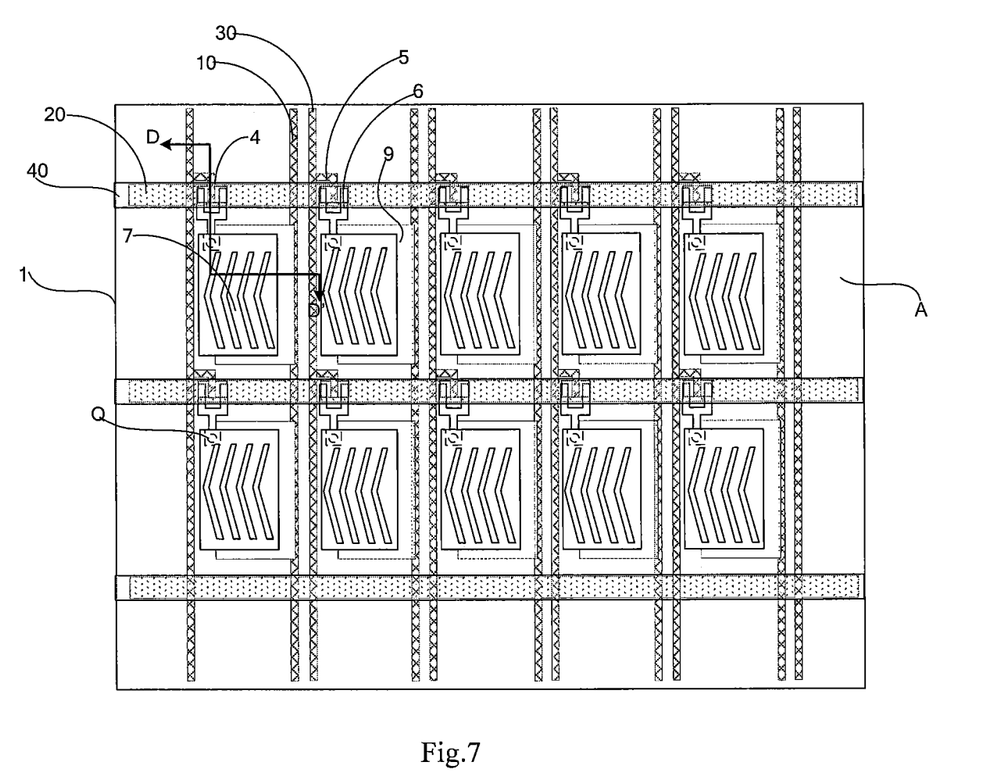
FIG. 7 is a plan view of another array substrate provided by an embodiment of the present disclosure.
Figure 8:
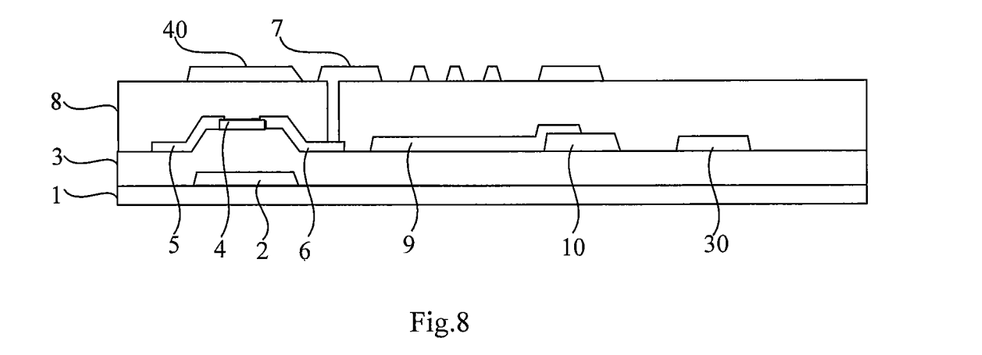
FIG. 8 is a sectional view of another array substrate provided by an embodiment of the present disclosure taken along the D-D' direction in FIG. 7.
Figure 9:
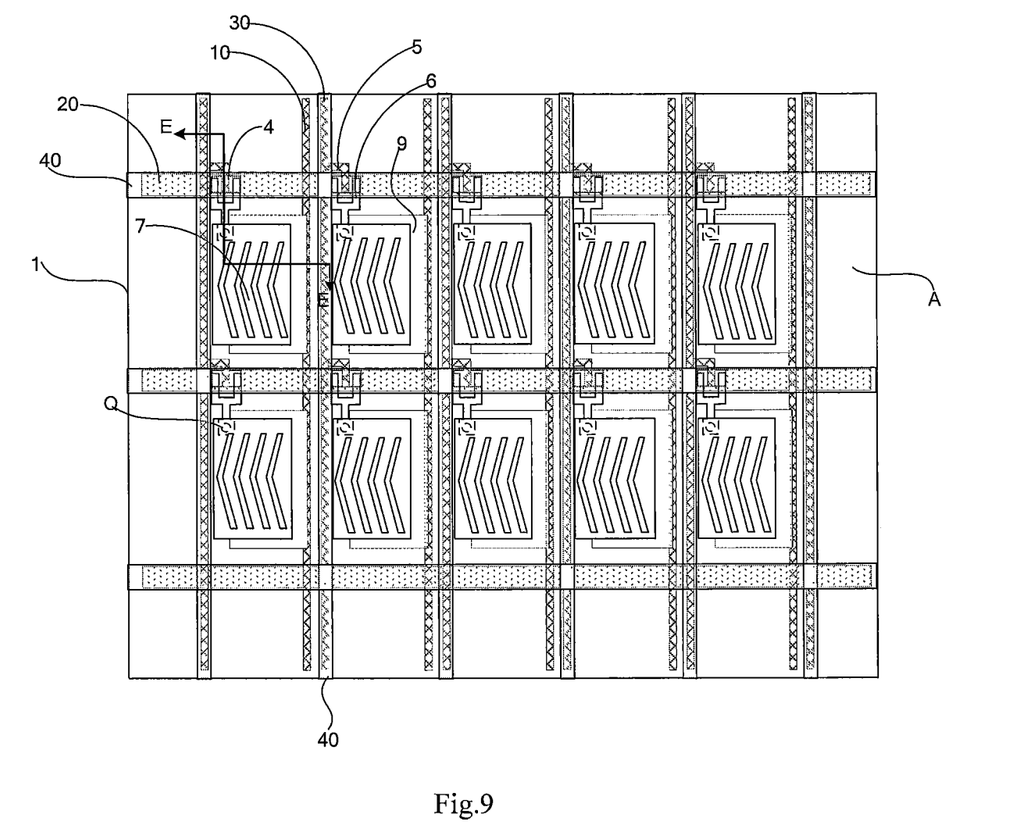
FIG. 9 is a plan view of another array substrate provided by an embodiment of the present disclosure.
Figure 10:
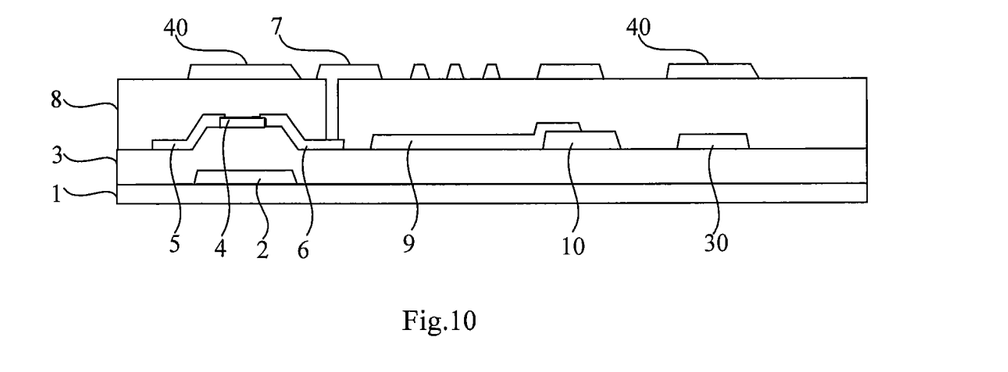
FIG. 10 is a sectional view of an array substrate provided by an embodiment of the present disclosure taken along the E-E' direction in FIG. 9.

By way of example, the gate lines 20 extend in the horizontal direction, and each of the gate lines 20 is electrically connected to gates 2 in a row of sub-pixels. The data lines 30 extend in the vertical direction, and each of the data lines 30 is electrically connected to sources 6 in a column of sub-pixels. As shown in FIG. 5 and FIG. 6, the orthographic projection of the shielding line 40 on the substrate 1 covers the orthographic projection of the data line 30 on substrate 1. As shown in FIG. 7 and FIG. 8, the orthographic projection of the shielding line 40 on the substrate 1 covers the orthographic projection of the gate line 20 on the substrate 1. As shown in FIG. 9 and FIG. 10, the orthographic projections of the shielding lines 40 on the substrate 1 cover the orthographic projections of the gate line 20 and the data line 30 on the substrate 1.

By making the shielding line 40 overlie the gate line 20 and/or the data line 30, it is possible to shield the impact of electromagnetic signals on the gate line 20 and/or data line 30 on liquid crystal molecules in regions corresponding to the gate line 20 and/or data line 30, which can prevent occurrence of light leakage in a liquid crystal display panel.

The shielding line 40 may be electrically connected to the common electrode line 10. As regards how the shielding line 40 is electrically connected to the common electrode wire 10, it is not limited herein.

In some embodiments of the present disclosure, the shielding line 40 is formed of the same material in the same layer as the pixel electrode 7. For example, the material of the pixel electrode 7 may be ITO or IZO (indium zinc oxide).

The shielding line 40 is formed of the same layer in the same layer as the pixel electrode 7, that is, the shielding line 40 and the pixel electrode 7 are formed by the same patterning process. In this way, the number of patterning processes can be reduced and the manufacturing process can be simplified.

Figure 11:
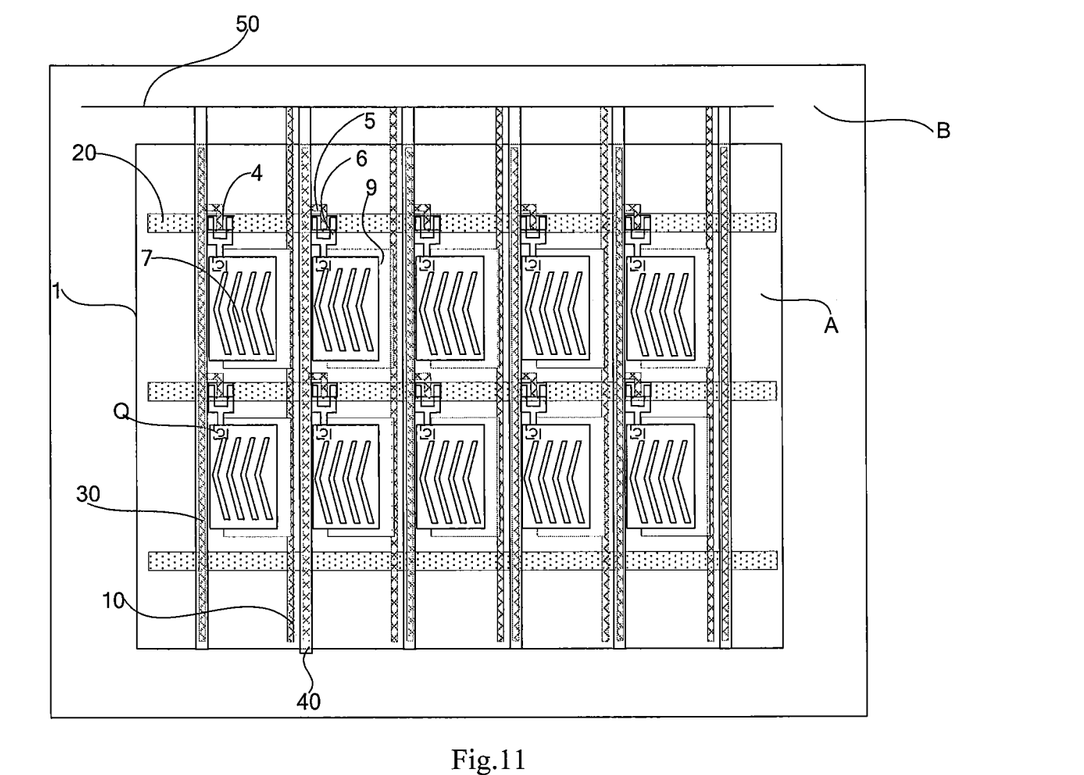
FIG. 11 is a plan view of a further array substrate provided by an embodiment of the present disclosure.

In other embodiments of the present disclosure, as shown in FIG. 11, each data line 30 is electrically connected to sources 5 in a column of sub-pixels arranged in an extension direction of the data line 30. The common electrode lines 10 are plural in number and are parallel to the data lines 30. Each common electrode line 10 is electrically connected to common electrodes 9 in a column of sub-pixels arranged in an extension direction of the common electrode line 10. The array substrate further comprises a peripheral area B surrounding the display area A. A common electrode auxiliary line 50 is disposed in the peripheral area B, which is electrically connected to the common electrode line 10 so that the common electrodes 9 in all the sub-pixels are electrically connected.

In an exemplary embodiment of the present disclosure, the gate lines 20 extend in the horizontal direction, and each of the gate lines 20 is electrically connected to gates 2 in a row of sub-pixels. The data lines 30 extend in the vertical direction, and each of the data lines 30 is electrically connected to sources 5 in a column of sub-pixels. The common electrode lines 10 extend in the vertical direction, and each of the common electrode lines 10 is electrically connected to common electrodes 9 in a column of sub-pixels. The common electrode auxiliary line 50 extends in the horizontal direction, and electrically connects the respective common electrode lines 10. On such basis, the common electrode auxiliary line 50 may further be electrically connected to the shielding line 40.

As shown in FIG. 11, the common electrode auxiliary line 50 is electrically connected to the common electrode line 10 and the shielding line 40 overlying the data line 30. The common electrode line 10 and the shielding line 40 are supplied with a common electrode signal through the common electrode auxiliary line 50.

In this embodiment, by disposing the common electrode line 10 in parallel with the data line 30, electrically connecting each common electrode line 10 to common electrodes 9 in a column of sub-pixels arranged in an extension direction of the common electrode line 10, and electrically connecting the respective common electrode lines 10 to the common electrode auxiliary line 50 in the peripheral area B, the common electrodes 9 in all the sub-pixels of the entire array substrate can be electrically connected.

In some embodiments of the present disclosure, as shown in FIGS. 3 to 11, the pixel electrode 7 is a slit electrode, and the common electrode 9 is a platelike electrode or a slit electrode. FIGS. 3 to 11 only illustrate the case where the common electrode 9 is a platelike electrode.

In the description of the above embodiments, specific features, structures, materials or characteristics may be combined in a suitable manner in any one or more embodiments or examples.

An embodiment of the present disclosure further provides a display panel comprising the array substrate as described above.

On such basis, the display panel further comprises a counter substrate for assembly with the array substrate. The counter substrate may comprise a color filter and a black matrix.

The beneficial effects of the display panel provided by the embodiment of the present disclosure are the same as those of the array substrate provided by the above-described technical solution, and are not described herein again.

Figure 12:
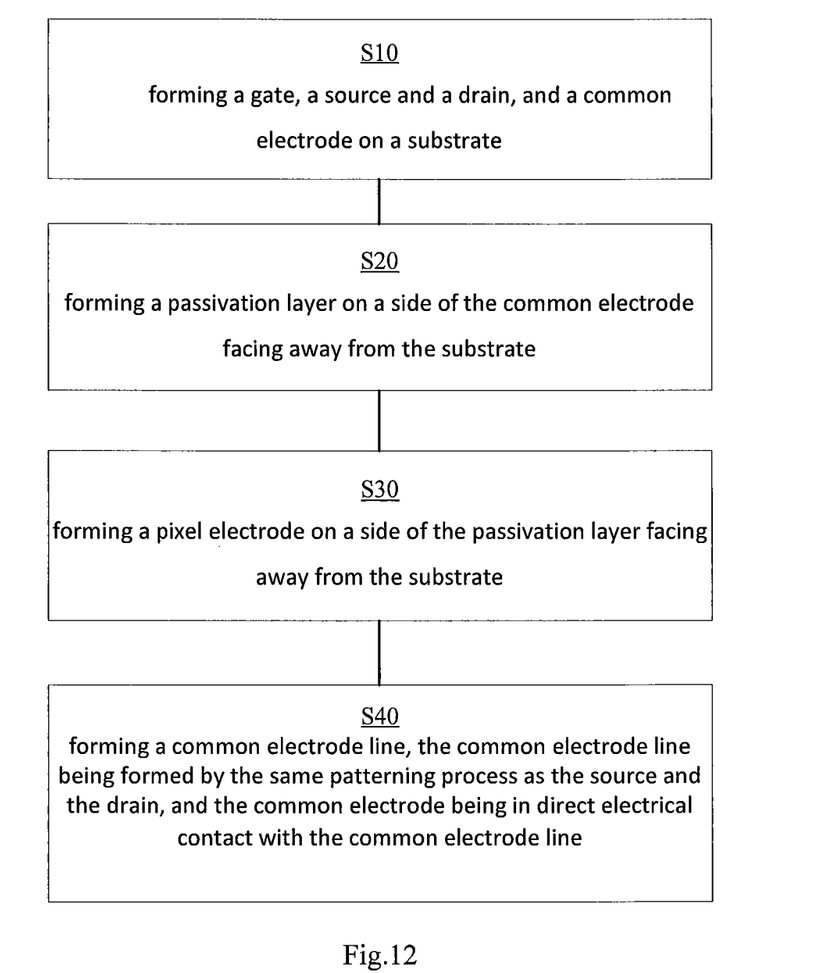
FIG. 12 is a flow chart of a method for manufacturing an array substrate provided by an embodiment of the present disclosure.

An embodiment of the present disclosure further provides a method for manufacturing an array substrate, as shown in FIG. 12, comprising:

at step S10, as shown in FIG. 3 and FIG. 4, forming a gate 2, a source 5 and a drain 6, and a common electrode 9 on a substrate 1;

next, at step S20, forming a passivation layer 8 on a side of the common electrode 9 facing away from the substrate 1;

then, at step S30, forming a pixel electrode 7 on a side of the passivation layer 8 facing away from the substrate 1.

Further, the above method for manufacturing an array substrate further comprises forming a common electrode line 10 at step S40. The common electrode line 10 is formed by the same patterning process as the source 5 and the drain 6, and the common electrode 9 is in direct electrical contact with the common electrode line 10. In addition, the pixel electrode 7 and the drain 6 are electrically connected through a via hole Q in the passivation layer 8.

In the above method for manufacturing an array substrate provided by the embodiment of the present disclosure, each sub-pixel is provided with one common electrode which is connected to a common electrode line and supplied with a common electrode signal through the common electrode line, so that the resistances on all the common electrodes are uniform. On such basis, by forming the common electrode line of the same material in the same layer as the source and drain, and making the common electrode in direct contact with the common electrode line, the common electrode can be connected to the common electrode line without a via hole, and each sub-pixel is only provided with one via hole for electrically connecting the pixel electrode to the drain. As a result, the manufacturing process for the array substrate provided by an embodiment of the present disclosure is simpler, and the problem of uneven coating of the alignment layer due to the large number of via holes in the related art can be improved.

In an exemplary embodiment of the present disclosure, referring to FIG. 3 and FIG. 4, the common electrode 9 covers a portion of the common electrode line 10, that is, the orthographic projection of the common electrode 9 on the substrate 1 at least partially overlaps that of the common electrode line 10 on the substrate 1.

In some embodiments of the present disclosure, as shown in FIGS. 3 to 11, the method for manufacturing an array substrate further comprises forming a plurality of gate lines 20 and a plurality of data lines 30. Each gate line 20 is electrically connected to gates 2 in a row of sub-pixels arranged in an extension direction of the gate line 20, and each data line 30 is electrically connected to sources 6 in a column of sub-pixels arranged in an extension direction of the data line 30. Further, as shown in FIGS. 5 to 11, the method for manufacturing an array substrate further comprises forming a shielding line 40. The orthographic projection of the shielding line 40 on the substrate covers that of the gate line 20 and/or the data line 30 on the substrate. The shielding line 40 and the pixel electrode 7 are formed by the same patterning process.

What have been stated above are merely specific embodiments of the present disclosure, but the scope of the present disclosure is not so limited. Variations or substitutions that can be readily conceived by any skilled is person familiar with this technical field within the technical scope revealed by the present disclosure shall be encompassed in the scope of the present disclosure. Therefore, the scope of the present disclosure should be determined by the scope of the claims.

The invention claimed is:

1. An array substrate comprising a plurality of sub-pixels arranged in a matrix, each sub-pixel of the plurality of sub-pixels comprising:
   a substrate;
   a gate, a source and a drain, and a common electrode on the substrate;
   a passivation layer on a side of the common electrode facing away from the substrate; and
   a pixel electrode on a side of the passivation layer facing away from the substrate,
   wherein the array substrate further comprises a common electrode line, the common electrode line comprises a same material and is in a same layer as the source and the drain,
   wherein the common electrode is in direct electrical contact with the common electrode line,
   wherein the pixel electrode and the drain are electrically connected through a via hole in the passivation layer,
   wherein the array substrate further comprises a data line, the data line extends in an extension direction of the common electrode line, and
   wherein the common electrode line is electrically connected to common electrodes of sub-pixels arranged in the extension direction of the common electrode line.

2. The array substrate according to claim 1, wherein the common electrode overlaps at least a portion of the common electrode line.

3. An array substrate comprising a plurality of sub-pixels arranged in a matrix, each sub-pixel of the plurality of sub-pixels comprising:
   a substrate;
   a gate, a source and a drain, and a common electrode on the substrate;
   a passivation layer on a side of the common electrode facing away from the substrate; and
   a pixel electrode on a side of the passivation layer facing away from the substrate,
   wherein the array substrate further comprises a common electrode line, the common electrode line comprises a same material and is in a same layer as the source and the drain,
   wherein the common electrode is in direct electrical contact with the common electrode line, and
   wherein the pixel electrode and the drain are electrically connected through a via hole in the passivation layer,
   wherein the array substrate further comprises:
   a plurality of gate lines extending in a first direction and a plurality of data lines extending in a second direction, wherein each of the gate lines is electrically connected to gates of a plurality of sub-pixels arranged in the first direction, and wherein each of the data lines is electrically connected to sources of a plurality of sub-pixels arranged in the second direction; and
   a shielding line, wherein an orthographic projection of the shielding line on the substrate overlaps orthographic projections of one or more of the gate lines and the data lines on the substrate.

4. The array substrate according to claim 3, wherein the shielding line comprises a same material in a same layer as the pixel electrode.

5. The array substrate according to claim 3, wherein the shielding line is electrically connected to the common electrode line.

6. The array substrate according to claim 1,
   wherein the array substrate further comprises a peripheral area surrounding a display area,
   wherein the peripheral area comprises a common electrode auxiliary line,
   wherein the common electrode auxiliary line is electrically connected to the common electrode line.

7. The array substrate according to claim 6, further comprising:
   a plurality of gate lines extending in a first direction and a plurality of data lines extending in the extension direction of the common electrode line, the extension direction of the common electrode line is a second direction, wherein each of the gate lines is electrically connected to gates of a plurality of sub-pixels arranged in the first direction, and wherein each of the data lines is electrically connected to sources of a plurality of sub-pixels arranged in the second direction; and
   a shielding line, wherein an orthographic projection of the shielding line on the substrate overlaps orthographic projections of one or more of the gate lines and the data lines on the substrate,
   wherein the plurality of data lines are parallel to a plurality of common electrode lines comprising the common electrode line, and wherein the common electrode auxiliary line is electrically connected to the shielding line.

8. An array substrate comprising a plurality of sub-pixels arranged in a matrix, each sub-pixel of the plurality of sub-pixels comprising:
a substrate;
a gate, a source and a drain, and a common electrode on the substrate;
a passivation layer on a side of the common electrode facing away from the substrate; and
a pixel electrode on a side of the passivation layer facing away from the substrate,
wherein the array substrate further comprises a common electrode line, the common electrode line comprises a same material and is in a same layer as the source and the drain,
wherein the common electrode is in direct electrical contact with the common electrode line, and
wherein the pixel electrode and the drain are electrically connected through a via hole in the passivation layer,
wherein the pixel electrode comprises a first slit electrode, and
wherein the common electrode comprises one of a plate-like electrode and a second slit electrode.

9. A display panel comprising the array substrate according to claim 1.

10. The display panel according to claim 9, wherein the common electrode overlaps at least a portion of the common electrode line.

11. The display panel according to claim 9, further comprising:
a plurality of gate lines extending in a first direction and a plurality of data lines extending in the extension direction of the common electrode line, the extension direction of the common electrode line is a second direction, wherein each of the gate lines is electrically connected to gates of a plurality of sub-pixels arranged in the first direction, and wherein each of the data lines is electrically connected to sources of a plurality of sub-pixels arranged in the second direction; and
a shielding line, wherein an orthographic projection of the shielding line on the substrate overlaps orthographic projections of one or more of the gate lines and the data lines on the substrate.

12. The display panel according to claim 11, wherein the shielding line is formed of a same material in a same layer as the pixel electrode.

13. The display panel according to claim 11, wherein the shielding line is electrically connected to the common electrode line.

14. The display panel according to claim 9,
wherein the array substrate further comprises a peripheral area surrounding a display area, the peripheral area comprising a common electrode auxiliary line, and
wherein the common electrode auxiliary line is electrically connected to the common electrode line.

15. The display panel according to claim 14, further comprising:
a plurality of gate lines extending in a first direction and a plurality of data lines extending in the extension direction of the common electrode line, the extension direction of the common electrode line is a second direction, wherein each of the gate lines is electrically connected to gates of a plurality of sub-pixels arranged in the first direction, and wherein each of the data lines is electrically connected to sources of a plurality of sub-pixels arranged in the second direction; and
a shielding line, wherein an orthographic projection of the shielding line on the substrate overlaps orthographic projections of one or more of the gate lines and the data lines on the substrate,
wherein the plurality of data lines are parallel to a plurality of common electrode lines comprising the common electrode line, and
wherein the common electrode auxiliary line is electrically connected to the shielding line.

16. The display panel according to claim 9,
wherein the pixel electrode comprises a first slit electrode, and
wherein the common electrode comprises one of a plate-like electrode and a second slit electrode.

17. A method for manufacturing the array substrate according to claim 1, comprising:
forming the gate, the source and the drain, and the common electrode on the substrate;
forming the passivation layer on the side of the common electrode facing away from the substrate;
forming the pixel electrode on the side of the passivation layer facing away from the substrate; and
forming the common electrode line,
wherein the common electrode line is formed by a same patterning process as the source and the drain.

18. The method for manufacturing the array substrate according to claim 17, wherein the common electrode overlaps at least a portion of the common electrode line.

19. The method for manufacturing the array substrate according to claim 17, further comprising:
forming a plurality of gate lines extending in a first direction and a plurality of data lines extending in a second direction; and
forming a shielding line such that an orthographic projection of the shielding line on the substrate overlaps orthographic projections of one or more of the gate lines and the data lines on the substrate.

20. The method for manufacturing the array substrate according to claim 19, wherein the shielding line and the pixel electrode are formed by a same patterning process.

* * * * *